US012575311B2

(12) United States Patent
Zhao et al.

(10) Patent No.: US 12,575,311 B2
(45) Date of Patent: Mar. 10, 2026

(54) DISPLAY SUBSTRATE AND DISPLAY DEVICE

(71) Applicant: BOE Technology Group Co., Ltd., Beijing (CN)

(72) Inventors: Jia Zhao, Beijing (CN); Fangxu Cao, Beijing (CN); Pinfan Wang, Beijing (CN); Yaming Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 553 days.

(21) Appl. No.: 17/770,274

(22) PCT Filed: Jun. 9, 2021

(86) PCT No.: PCT/CN2021/099172
§ 371 (c)(1),
(2) Date: Apr. 19, 2022

(87) PCT Pub. No.: WO2022/017043
PCT Pub. Date: Jan. 27, 2022

(65) Prior Publication Data
US 2022/0393120 A1     Dec. 8, 2022

(30) Foreign Application Priority Data
Jul. 24, 2020    (CN) ......................... 202010723086.6

(51) Int. Cl.
   *H10K 77/10*       (2023.01)
   *G09F 9/30*       (2006.01)
   *H10K 102/00*       (2023.01)

(52) U.S. Cl.
   CPC ............ *H10K 77/111* (2023.02); *G09F 9/301* (2013.01); *H10K 2102/311* (2023.02)

(58) Field of Classification Search
CPC ........... H10K 2102/311; H10K 50/844; H10K 59/8731; H10K 77/10–111; G09G 2380/02; G09F 9/301
See application file for complete search history.

(56) References Cited

U.S. PATENT DOCUMENTS

2016/0268313 A1    9/2016   Qin et al.
2018/0358418 A1    12/2018   Hong et al.
(Continued)

FOREIGN PATENT DOCUMENTS

CN     205845416 U    12/2016
CN     107742639 A    2/2018
(Continued)

OTHER PUBLICATIONS

ESPACENET English Translation with paragraph numbers of CN 109065552 A (Year: 2018).*
(Continued)

*Primary Examiner* — Julio J Maldonado
*Assistant Examiner* — Nathan Pridemore
(74) *Attorney, Agent, or Firm* — IPro, PLLC

(57) ABSTRACT

Provided is a display substrate. The display substrate includes: a flexible substrate, including a non-stretch region and at least one stretch region, wherein each of the at least one stretch region is proximate a boundary of the flexible substrate relative to the non-stretch region, and each of the at least one stretch region includes a first region, a second region, and a third region that are sequentially arranged in a direction going distal from the non-stretch region, and at least part of the first region and at least part of the third region have a thickness smaller than that of the second region, the second region has a thickness equal to that of the non-stretch region; and a functional film layer on one side of the flexible substrate.

15 Claims, 4 Drawing Sheets

(56) References Cited

U.S. PATENT DOCUMENTS

| 2019/0269011 | A1 |   | 8/2019  | Lee et al. |              |
|--------------|----|---|---------|------------|--------------|
| 2020/0176696 | A1 |   | 6/2020  | Dai        |              |
| 2020/0235139 | A1 | * | 7/2020  | Ke         | H10D 86/0212 |
| 2020/0266369 | A1 |   | 8/2020  | Xu et al.  |              |
| 2021/0376038 | A1 | * | 12/2021 | Won        | H10K 59/123  |
| 2021/0408405 | A1 |   | 12/2021 | Hu         |              |
| 2022/0181408 | A1 | * | 6/2022  | Ji         | G02F 1/13    |

FOREIGN PATENT DOCUMENTS

| CN | 108766977   | A |   | 11/2018 |               |
|----|-------------|---|---|---------|---------------|
| CN | 109065552   | A | * | 12/2018 | H01L 27/1222  |
| CN | 109659318   | A |   | 4/2019  |               |
| CN | 109830621   | A |   | 5/2019  |               |
| CN | 110189631   | A |   | 8/2019  |               |
| CN | 110428731   | A | * | 11/2019 | G02F 1/133305 |
| CN | 110570764   | A |   | 12/2019 |               |
| CN | 110901186   | A |   | 3/2020  |               |
| CN | 111816080   | A |   | 10/2020 |               |
| KR | 20180000822 | A |   | 1/2018  |               |

OTHER PUBLICATIONS

ESPACENET English Translation with paragraph numbers of CN 110428731 A (Year: 2019).*

PE2E Merged Original and Translation of CN 109065552 A (Year: 2018).*

PE2E Merged Original and Translation of CN 110428731 A (Year: 2019).*

CN202010723086.6 first office action.

* cited by examiner

DISPLAY SUBSTRATE AND DISPLAY DEVICE

CROSS-REFERENCE TO RELATED APPLICATION

This application is a US national stage of international application No. PCT/CN2021/099172, filed on Jun. 9, 2021, which claims priority to Chinese Patent Application No. 202010723086.6, filed on Jul. 24, 2020 and entitled "DISPLAY SUBSTRATE AND DISPLAY DEVICE," the contents of which are herein incorporated by reference in their entirety.

TECHNICAL FIELD

The present disclosure relates to the field of display technology, and in particular, to a display substrate and a display device.

BACKGROUND

With the development of science and technologies, curved display devices are becoming increasingly favored. A curved display device generally includes a curved cover glass and a flexible display substrate attached to the curved cover glass. The curved cover glass may be a boundary plate that is bent inward, and the flexible display substrate may be attached to an inner side of the curved cover glass. Both a front side and lateral sides of the curved display device composed of the curved cover glass and the flexible display substrate may be used to display images.

SUMMARY

The present disclosure provides a display substrate and a display device. The technical solutions are as follows:

In one aspect, a display substrate is provided. The display substrate includes:

a flexible substrate, including a non-stretch region and at least one stretch region, wherein each stretch region is proximal to a boundary of the flexible substrate relative to the non-stretch region, and each stretch region includes a first region, a second region, and a third region that are sequentially arranged in a direction going away from the non-stretch region, and at least part of the first region and at least part of the third region has a thickness smaller than that of the second region, the second region has thickness equal to that of the non-stretch region;

and a functional film layer on one side of the flexible substrate.

Optionally, the functional film layer includes traces, wherein an orthographic projection of the traces on the flexible substrate is overlapped with the first region and the second region, and an orthographic projection of the traces on the flexible substrate is not overlapped with the third region.

Optionally, the first region includes a plurality of first hole structures, and the third region includes a plurality of second hole structures.

Optionally, each of the first hole structures and each of the second hole structures is in a strip shape.

Optionally, the plurality of first hole structures include: at least one first hole structure extending in a first direction and at least one first hole structure extending in a second direction;

wherein the first direction is intersected with the second direction.

Optionally, the plurality of second hole structures include: at least one second hole structure extending in a third direction and at least one second hole structure extending in a fourth direction;

wherein the third direction is intersected with the fourth direction.

Optionally, the extending directions of the plurality of first hole structures are parallel; and/or the extending directions of the plurality of second hole structures are parallel.

Optionally, a boundary line between the second region and the third region is an arc; and the extending directions are parallel to a tangent to the arc, or the extending directions are perpendicular to a tangent to the arc.

Optionally, the first hole structure is a through hole or a blind hole, and the second hole structure is a through hole or a blind hole.

Optionally, the functional film layer further includes: a barrier;

wherein an orthographic projection of the barrier on the flexible substrate is not overlapped with the first hole structure and the second hole structure.

Optionally, the functional film layer further includes: a first pixel in the non-stretch region, and a second pixel in the first region;

wherein an orthographic projection of the second pixel on the flexible substrate is not overlapped with the first hole structure.

Optionally, the display substrate further includes: a packaging film layer;

wherein the packaging film layer is disposed on one side, distal from the flexible substrate, of the functional film layer.

Optionally, the packaging film layer includes: an inorganic layer and an organic layer that are sequentially laminated in a direction going away from the flexible substrate;

wherein an orthographic projection of the inorganic layer on the flexible substrate is overlapped with the first region, the second region, and the third region, an orthographic projection of the organic layer on the flexible substrate is overlapped with the first region, and an orthographic projection of the organic layer on the flexible substrate is not overlapped with the second region or the third region.

Optionally, the flexible substrate is rectangular; and the flexible substrate has four of the stretch regions, wherein each stretch region is disposed at a corner of the flexible substrate.

In another aspect, a display device is provided. The display device includes: a curved cover glass, and a display substrate as described in the above aspects;

wherein the curved cover glass has a boundary that is bent to one side of the curved cover glass, and the display substrate is attached to the curved cover glass.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

In the related art, when a flexible display substrate is attached to a curved cover glass, the flexible display substrate is generally disposed on the inner side of the curved cover glass, and then the flexible display substrate is stretched to attach to the curved cover glass.

However, since the boundary of the curved cover glass is bent inwardly, the wrinkles are prone to occur at an edge portion by which the flexible display substrate is attached to the curved cover glass, thus leading to a poor display effect of a curved display device.

Figure 1:
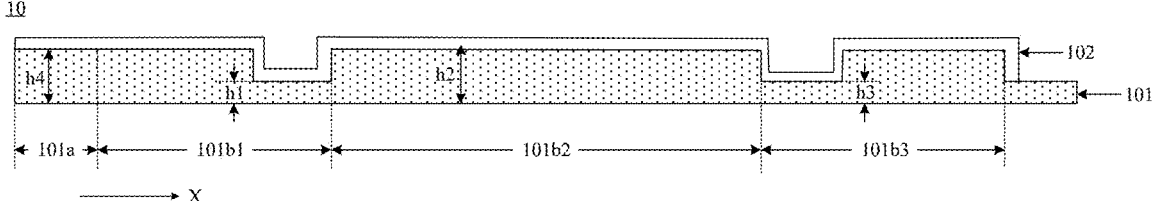
FIG. 1 is a schematic structural diagram of a display substrate according to an embodiment of the present disclosure.

FIG. 1 is a schematic structural diagram of a display substrate according to an embodiment of the present disclosure. As shown in FIG. 1, the display substrate 10 may include a flexible substrate 101 and a functional film layer 102 on one side of the flexible substrate 101.

Figure 2:
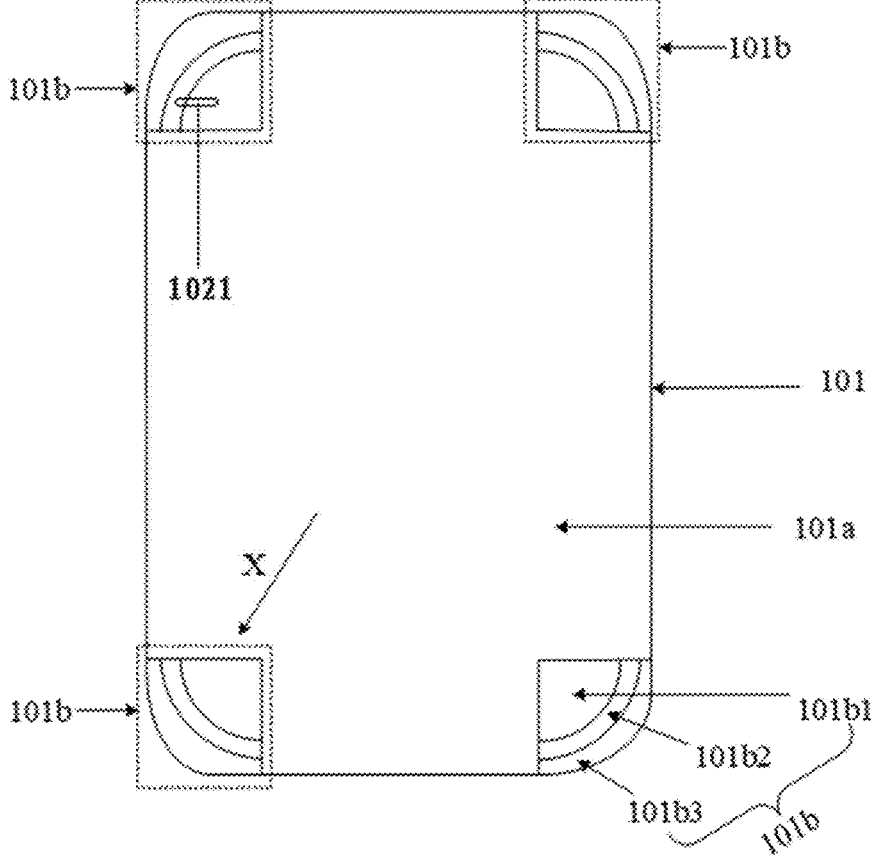
FIG. 2 is a top plan view of a flexible substrate in the display substrate shown in FIG. 1.

FIG. 2 is a top plan view of a flexible substrate in the display substrate shown in FIG. 1. Combined with FIG. 1 and FIG. 2, the flexible substrate 101 has a non-stretch region 101a and at least one stretch region 101b, for example, four stretch regions 101b are shown in FIG. 2. Each stretch region 101b includes a first region 101b1, a second region 101b2, and a third region 101b3 that are sequentially arranged in a direction X going away from the non-stretch region 101a.

As shown in FIG. 1, a thickness h1 of at least part of the first region 101b1 of the flexible substrate 101 and a thickness h3 of at least part of the third region 101b3 of the flexible substrate 101 are both smaller than a thickness h2 of the second region 101b2 of the flexible substrate 101, and the thickness h2 of the second region 101b2 of the flexible substrate 101 may be equal to a thickness h4 of the non-stretched region 101a of the flexible substrate 101.

Since the thickness h1 of at least part of the first region 101b1 of the flexible substrate 101 and the thickness h3 of at least part of the third region 101b3 of the flexible substrate 101 are smaller, the stretchability of the first region 101b1 of the flexible substrate 101 and the third region 101b3 of the flexible substrate 101 is enhanced. This enables good stretchability of the display substrate 10 formed by the flexible substrate 101, thereby enabling the display substrate

10 to be stretched to a preset position when the display substrate 10 is attached to the curved cover glass, ensuring the accuracy of attaching the display substrate 10 to the curved cover glass.

Moreover, as the second region 101b2 in the flexible substrate 101 has a uniform thickness h2, wherein the thickness h2 of the second region 101b2 is larger, the second region 101b2 in the flexible substrate 101 has larger rigidity, such that wrinkles are prevented at an edge portion by which the display substrate 10 is attached to the curved cover glass, achieving the effect of attaching the display substrate 10 to the curved cover glass, and the good display effect of a display device.

In summary, the embodiments of the present disclosure provide a display substrate. At least part of a first region and a third region of a flexible substrate included in a display substrate have a small thickness, and a region with a small thickness in the flexible substrate has good stretchability. Therefore, the first region and the third region of the flexible substrate have good stretchability, such that the accuracy of attaching the display substrate formed by the flexible substrate to a curved cover glass is ensured. Furthermore, as a second region of the flexible substrate has a uniform thickness and a large thickness, the second region has large rigidity, such that wrinkles are prevented at an edge portion by which the display substrate is attached to the curved cover glass, achieving the effect of attaching the display substrate to the curved cover glass, and the good display effect of a display device.

Optionally, the flexible substrate 101 may be made of a flexible material, for example, polyimide (PI).

With reference to FIG. 2, the flexible substrate 101 may be rectangular. The flexible substrate 101 may have four stretch regions 101b, each of which may be disposed at one corner of the flexible substrate 101. By way of example, the flexible substrate 101 may be a rounded rectangle, and each corner of the flexible substrate 101 may be rounded.

Since each of the four corners of the flexible substrate 101 has one stretch region 101b, and the stretchability of the first region 101b1 and the third region 101b3 in the stretch region 101b is enhanced, the stretchability of the four corners of the flexible substrate 101 is enhanced. Thereby, the stretchability of the four corners of the display substrate 10 formed by the flexible substrate 101 may be enhanced. When attaching the display substrate 10 to the rectangular curved cover plate, the four corners of the display substrate 10 are stretched to a preset position, such that the accuracy of attaching the four corners of the display substrate 10 conforms to the curved cover glass.

Meanwhile, since the second region 101b2 of each of the four corners of the flexible substrate 101 is more rigid, the four corners of the display substrate 10 are prevented from folding when the display substrate 10 is attached to the curved cover glass, thereby enhancing the effect of the display substrate 10 to conform to the curved cover glass, thereby improving the display effect of the display device.

Optionally, referring to FIG. 2, since the four corners of the flexible substrate 101 are rounded, the boundary line between the second region 101b2 and the third region 101b3 may be an arc, and the boundary line between the first region 101b1 and the second region 101b2 may also be an arc. The display substrate 10 may include a flexible substrate 101 and a functional film layer 102 (not shown) on one side of the flexible substrate 101. The functional film layer 102 may include traces 1021 that may be overlapped with the second region 101b2 on the flexible substrate 101.

5

Figure 3:
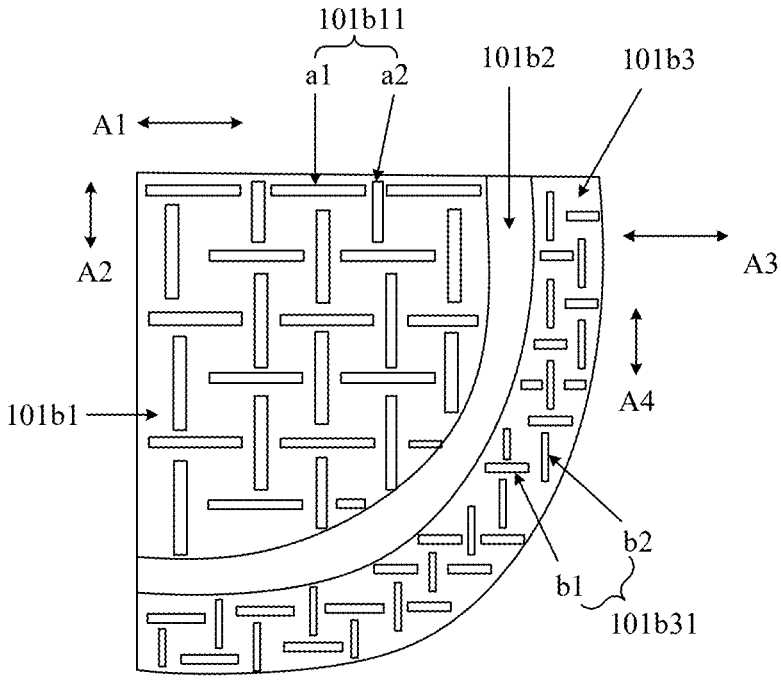
FIG. 3 is a partial top plan view of a display substrate according to an embodiment of the present disclosure.

FIG. 3 is a partial top plan view of a display substrate according to an embodiment of the present disclosure. With reference to FIG. 3, the first region 101*b*1 may include a plurality of first hole structures 101*b*11, and the third region 101*b*3 may include a plurality of second hole structures 101*b*31.

By configuration of the plurality of first hole structures 101*b*11 in the first region 101*b*1 of the flexible substrate 101 and the plurality of second hole structures 101*b*31 in the third region 101*b*3 of the flexible substrate 101, the thickness of the region in the first region 101*b*1 of the flexible substrate 101 where the first hole structure 101*b*11 is disposed, and the thickness of the region in the third region 101*b*3 of the flexible substrate 101 where the second hole structure 101*b*31 is disposed are small. Therefore, the stretchability of the first region 101*b*1 and the third region 101*b*3 of the flexible substrate 101 may be increased, thereby improving the accuracy of the display substrate 10 to the curved lid.

Optionally, referring to FIG. 3, each of the first hole structures 101*b*11 and each of the second hole structures 101*b*31 may be in a strip shape. Definitely, each of the first hole structures 101*b*11 and each of the second hole structures 101*b*31 may also be in other shapes, for example, a circular shape, which are not limited in the embodiments of the present disclosure.

Hereinto, the shape of the first hole structure 101*b*11 may refer to the shape of the orthographic projection of the first hole structure 101*b*11 on the flexible substrate 101, and the shape of the second hole structure 101*b*31 may refer to the shape of the orthographic projection of the second hole structure 101*b*31 on the flexible substrate 101.

In the embodiments of the present disclosure, the first hole structure 101*b*11 may be a through hole or a blind hole, and the second hole structure 101*b*31 may be a through hole or a blind hole, which is not limited in the embodiments of the present disclosure. The through hole refers to a hole opened through the flexible substrate 101. The blind hole refers to a hole opened on one side of the flexible substrate 101 approaching the functional film layer 102 and not opened through the flexible substrate 101.

Referring to FIG. 3, the plurality of first hole structures 101*b*11 may include at least one first hole structure a1 extending in a first direction A1 and at least one first hole structure a2 extending in a second direction A2. The first direction A1 may be intersected with the second direction A2. For example, referring to FIG. 3, the first direction A1 may be perpendicular to the second direction A2. Optionally, the first direction A1 may be a pixel row direction, and the second direction A2 may be a pixel column direction.

In the embodiment of the present disclosure, referring to FIG. 3, a plurality of first hole structures a1 extending in the first direction A1 may be provided, and a plurality of first hole structures a2 extending in the second direction A2 may be provided. The plurality of first hole structures a1 extending in the first direction A1, and the plurality of first hole structures a2 extending in the second direction A2 may be staggeredly arranged.

Referring to FIG. 3, the plurality of second hole structures 101*b*31 may include at least one second hole structure b1 extending in a third direction A3 and at least one second hole structure b2 extending in a fourth direction A4. The third direction A3 may be intersected with the fourth direction A4. For example, the third direction A3 may be perpendicular to the fourth direction A4. Optionally, the third direction A3 may be a pixel row direction, and the fourth direction A4 may be a pixel column direction.

In the embodiment of the present disclosure, referring to FIG. 3, in the plurality of second hole structures, a plurality of second hole structures b1 extending in the third direction A3 may be provided, and a plurality of second hole structures b2 extending in the fourth direction A4 may be provided. The plurality of second hole structures b1 extending in the third direction A3, and the plurality of second hole structures b2 extending in the fourth direction A4 may be staggeredly arranged.

Figure 4:
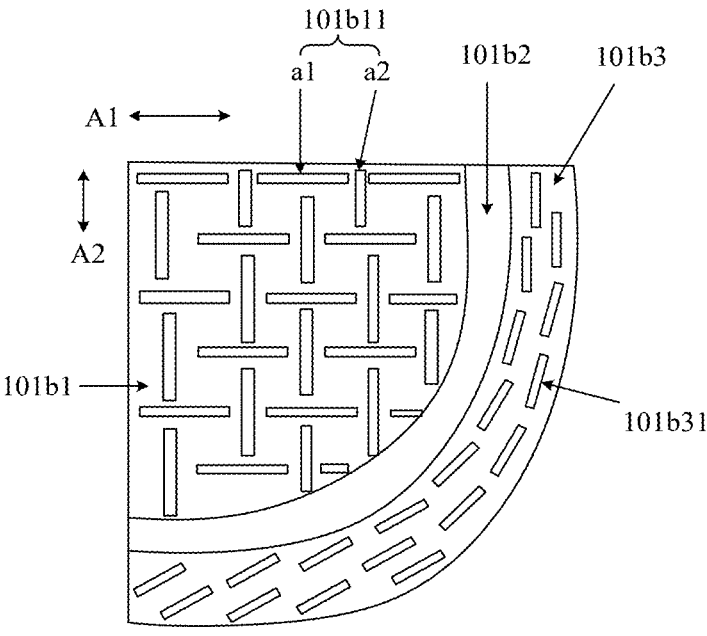
FIG. 4 is a partial top plan view of another display substrate according to an embodiment of the present disclosure.

FIG. 4 is a partial top plan view of another display substrate according to an embodiment of the present disclosure. With reference to FIG. 4, the extending directions of the plurality of second hole structures 101*b*31 may be parallel.

Figure 5:
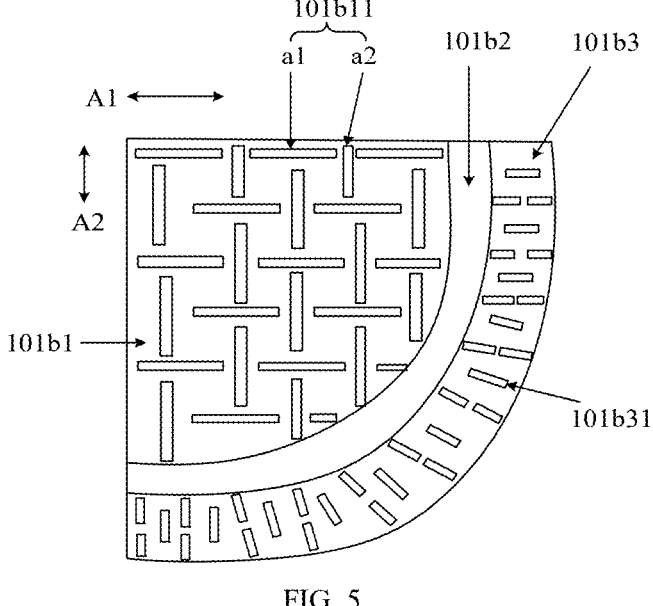
FIG. 5 is a partial top plan view of still another display substrate according to an embodiment of the present disclosure.

Optionally, referring to FIG. 4, assuming that the boundary line between the second region 101*b*1 and the third region 101*b*3 is an arc, then the extending directions of the plurality of second hole structures 101*b*31 may be parallel to the tangent of the arc. Optionally, referring to FIG. 5, the extending directions of the plurality of second hole structures 101*b*31 may be perpendicular to the tangent of the arc.

Optionally, the extending directions of the plurality of first hole structures 101*b*11 may also be parallel. For example, the extending directions of the plurality of first hole structures 101*b*11 may also be parallel to the tangent of the arc. Alternatively, the extending directions of the plurality of first hole structures 101*b*11 may be perpendicular to a tangent to the arc.

Definitely, the extending directions of the plurality of first hole structures 101*b*11, and the extending directions of the plurality of second hole structures 101*b*31 may also be other directions, which are not limited in the embodiments of the present disclosure.

Figure 6:
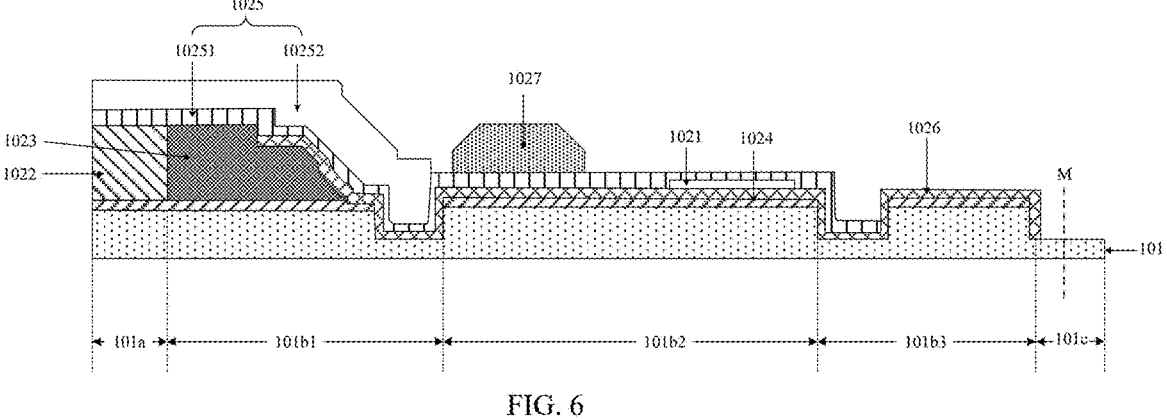
FIG. 6 is a schematic structural diagram of yet still another display substrate according to an embodiment of the present disclosure.
Figure 7:
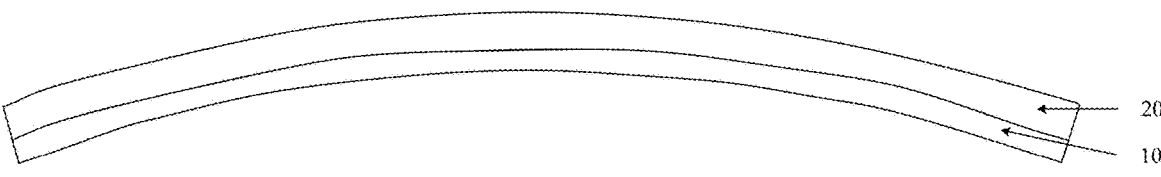
FIG. 7 is a schematic diagram of a display device according to an embodiment of the present disclosure.

FIG. 6 is a schematic structural diagram of another display substrate according to an embodiment of the present disclosure. With reference to FIG. 6, the functional film layer 102 may include traces 1021 that may be overlapped with the second region 101*b*2 on the flexible substrate 101. By disposing the traces 1021 in the second region 101*b*2 of the flexible substrate 101, the rigidity of the second region 101*b*2 of the flexible substrate 101 is further improved, preventing wrinkles at the edge portion by which the display substrate (10) is attached to the curved cover glass, achieving the effect of attaching the display substrate (10) to the curved cover glass.

The functional film layer 102 may further include a first pixel 1022 in the non-stretch region 101*a*, and a second pixel 1023 in the first region 101*b*1. That is, both the non-stretch region 101*a* and the first region 101*b*1 are provided with pixels. In other words, both the non-stretch region 101*a* and the first region 101*b*1 may be used to display an image, and may constitute a display region of the flexible substrate 101.

Since the second pixel 1023 included in the functional film layer 102 is disposed in the first region 101*b*1, and the first region 101*b*1 includes a plurality of first hole structures 101*b*11, the orthographic projection of the second pixel 1023 on the flexible substrate 101 is not overlapped with the first hole structures 101*b*11, thereby ensuring the performance of the second pixel 1023 disposed in the first region 101*b*1.

In this embodiment, the traces 1021 may be disposed in a gate driver on array (GOA) region, which may be positive power traces (which may be referred to as VDD traces or VDD power supply lines). Since the traces 1021 need to be connected to the second pixel 1023 disposed in the first region 101*b*1 to supply a driving signal to the second pixel 1023, the traces 1021 may also be located in the first region 101b1, thereby facilitating connection of the traces 1021 to the second pixel 1023. That is, the orthographic projection of the traces 1021 on the flexible substrate 101 may also be overlapped with the first region 101b1. Further, the orthographic projection of the traces 1021 on the flexible substrate 101 is not overlapped with that of the second pixel 1023 on the flexible substrate 101.

It should be noted that since the first region 101b1 of the flexible substrate 101 is provided with traces 1021, the traces 1021 may affect the stretchability of the first region 101b1. Therefore, to ensure that the first region 101b1 has good stretchability, a region for accommodating the traces 021, namely, a traces region, in the first region 101b1 of the flexible substrate 101 may have a thickness smaller than that of the non-stretch region 101a.

The trace region may refer to a region in the first region 101b1 not in which the second pixel 1023 and the first hole structure 101b11 are not disposed. An orthographic projection of the traces 1021 on the flexible substrate 101 may be located within the trace region. That is, the orthographic projection of the traces on the flexible substrate 101 and the orthographic projection of the second pixel 1023 on the flexible substrate 101, and the orthographic projection of the first hole structure 10b11 on the flexible substrate 101 are not overlapped with each other.

Since the thickness of the trace region is small, even if the first region 101b1 of the flexible substrate 101 is provided with traces 1021, no greater impact is exerted on the stretchability of the first region 101b1, ensuring that the first region 101b1 of the flexible substrate 101 has good stretchability.

In the embodiments of the present disclosure, the traces 1021 also need to be connected to the first pixel 1022 in the non-stretch region 101a to supply a driving signal to the first pixel 1022. The trace 1021 may thus also be disposed in the non-stretch region 101a, thereby facilitating connection of the traces 1021 to the first pixel 1022. That is, the orthographic projection of the traces 1021 on the flexible substrate 101 may also be overlapped with the non-stretch region 101a. Further, the orthographic projection of the traces 1021 on the flexible substrate 101 is not overlapped with the orthographic projection of the first pixel 1022 on the flexible substrate 101.

Moreover, the orthographic projection of the traces 1021 on the flexible substrate 101 is not overlapped with the third region 101b3, which can avoid a larger thickness of the third region 101b3 of the flexible substrate 101, and the stretchability of the third region 101b3 of the flexible substrate 101 is enhanced.

In the embodiment of the present disclosure, the first pixel 1022 in the non-stretch region 101a and the second pixel 1023 in the first region 101b1 may each include a plurality of sub-pixels of different colors. For example, a red (R) subpixel, a green (G) subpixel, and a blue (B) subpixel may be included.

Each sub-pixel may include a thin-film transistor (TFT) and a light-emitting unit. The thin film transistor may include an active layer, a gate electrode (G), source electrode (S), and a drain electrode (D). The light emitting unit may include an anode layer, a light emitting layer, and a cathode layer that are sequentially laminated in a direction going away from the flexible substrate 101. The source electrode and the drain electrode may each be connected to the active layer, and the drain electrode may be connected to the anode layer. Optionally, the cathode layer may be made of silver (Ag) or magnesium (Mg).

Still with reference to FIG. 6, the functional film layer 102 may also include a barrier 1024. The orthographic projection of the barrier 1024 on the flexible substrate 101 is not overlapped with the first hole structure 101b11 and the second hole structure 101b31. Thereby, larger thicknesses of the first hole structure 101b11 and the second hole structure 101b31 of the flexible substrate 101 are prevented, causing the first region 101b1 of the flexible substrate 101 and the third region 101b3 of the flexible substrate 101 to have good stretchability. Optionally, the barrier 1024 may be made of an inorganic material, for example, a silicon nitride (SiNx).

With reference to FIG. 6, the display substrate 10 may further include a packaging film layer (TFE) 1025. The packaging film layer 1025 may be disposed on one side, distal from the flexible substrate 101, of the functional film layer 102, which may be used to package the functional film layer 102 on the flexible substrate 101, preventing moisture and oxygen from entering the functional film layer 102, ensuring the performance of the functional film layer 102.

Referring to FIG. 6, the packaging film layer 1025 may include an inorganic layer 10251 and an organic layer 10252 that are sequentially laminated in a direction going away from the flexible substrate 101. An orthographic projection of the inorganic layer 10251 on the flexible substrate 101 may be overlapped with the first region 101b1, the second region 101b2, and the third region 101b3. An orthographic projection of the organic layer 10252 on the flexible substrate 101 may be overlapped with the first region 101b1, and not overlapped with the second region 101b2 and the third region 101b3. The packaging film layer 1025 in the display substrate 10 provided by embodiments of the present disclosure reduces an inorganic layer compared with the existing technology, which can make the thickness of the stretch area 101B smaller and the stretch region 101B has good strechability.

Optionally, the inorganic layer 10251 may be made of an inorganic material. For example, the inorganic layer 10251 may be made of one or more inorganic oxides, for example, SiNx, a silicon oxide (SiOx), and a silicon oxynitride (SiOxNy). The organic layer 10252 may be made of an organic material. For example, the organic layer 10252 may be made of a resin material. The resin may be a thermoplastic resin or a thermosetting resin, the thermoplastic resin may include acrylic (PMMA) resin, and the thermosetting resin may include an epoxy resin.

Still with reference to FIG. 6, the display substrate 10 may further include a passivation layer (PVX) 1026. The passivation layer 1026 may be disposed on one side, distal from the flexible substrate 101, of the barrier 1025. An orthographic projection of the passivation layer 101 on the flexible substrate 101 may be overlapped with the first region 101b1, the second region 101b2, and the third region 101b3. Optionally, the passivation layer 1026 may be made of an inorganic material, for example, a SiNx material.

Referring to FIG. 6, the display substrate 10 may further include a blocking structure 1027. An orthographic projection of the blocking structure 1027 on the flexible substrate 101 may be overlapped with the second region 101b2 and not overlapped with the first region 101b1 and the third region 101b3. The blocking structure 1027 may prevent overflow of the organic layer 10252 disposed in the blocking structure proximal to the non-stretching region 101a.

Since the orthographic projection of the blocking structure 1027 on the flexible substrate 101 is not overlapped with the first region 101b1 and the third region 101b3, the thicknesses of the first region 101b1 and the third region 101*b*3 are prevented from being smaller, affecting the stretchability of the first region 101*b*1 and the third region 101*b*3.

In general, to make the display substrate 10 closely attach to the curved cover glass, the display substrate 10 may be made larger in size, i.e., the size of the flexible substrate 101 may be made larger. Referring to FIG. 6, the flexible substrate 101 also includes a cut region 101*c* in the flexible substrate 101 located on one side, distal from the non-stretch region 101*a*, of the stretch region 101*b*. In the embodiment of the present disclosure, after the display substrate 10 is attached to the curved cover glass, the portion of the display substrate 10 that exceeds the curved cover glass needs to be removed to ensure that the shape of the display substrate 10 matches the shape of the curved cover glass.

For example, referring to FIG. 6, prior to cutting the display substrate 10, the position of the cutting line M may be determined in the cutting area 101*c*, and the display substrate 10 may be cut along the cutting line M in a laser cut manner to match the shape of the display substrate 10 with the curved cover glass.

In summary, the embodiments of the present disclosure provide a display substrate. At least part of a first region and a third region of a flexible substrate included in a display substrate have a small thickness, and a region with a small thickness in the flexible substrate has good stretchability. Therefore, the first region and the third region of the flexible substrate have good stretchability, such that the accuracy of attaching the display substrate formed by the flexible substrate to a curved cover glass is ensured. Furthermore, as a second region of the flexible substrate has a uniform thickness and a large thickness, the second region has large rigidity, such that wrinkles are prevented at an edge portion by which the display substrate is attached to the curved cover glass, achieving the effect of attaching the display substrate to the curved cover glass, and the good display effect of a display device.

An embodiment of the present disclosure further provides a display device which may include a curved cover glass (CG) 20 and a display substrate 10 as provided in the embodiments described above. The boundary of the curved cover glass 20 may be bent to one side, and the display substrate 10 may be attached to the curved cover glass 20.

The curved cover glass may be a rectangular glass cover plate, and the four corners of the curved cover glass may be bent to the same side. For example, the four corners may be bent in a direction close to the display substrate 10. In the case that the display substrate 10 is attached to the curved cover glass, four corner-bent display devices may be obtained.

Alternatively, the display device may be an electronic paper, an organic light-emitting diode (OLED) display device, a cell phone, a tablet computer, a television, a display, a laptop computer, a digital photo frame or navigator, or the like, or any product or component having a display function.

It should be pointed out that the term "at least one" in the present disclosure means one or more, and that the term "a plurality of" in the present disclosure means two or more.

It should be understood that the term "and/or" indicates that three types of relationships may exist. For example, A and/or B, may indicate: A exists alone, A and B exist simultaneously, and B exists alone. The symbol "/" generally indicates that the contextual object is an "or" relationship.

Described above are merely exemplary embodiments of the present disclosure and are not intended to limit the present disclosure. Any modifications, equivalent substitutions, improvements, and the like are within the protection scope of the present disclosure, without departing from the spirit and principles of the present disclosure.

What is claimed is:

1. A display substrate, comprising:
a flexible substrate, comprising a non-stretch region and at least one stretch region, wherein each of the at least one stretch region is proximate a boundary of the flexible substrate relative to the non-stretch region, and each of the at least one stretch region comprises a first region, a second region, and a third region that are sequentially arranged in a direction going away from the non-stretch region, and at least part of the first region and at least part of the third region have a thickness smaller than that of the second region, the second region has a thickness equal to that of the non-stretch region; and
a functional film layer on one side of the flexible substrate,
wherein both the non-stretch region and the first region constitute a display region of the flexible substrate,
wherein the functional film layer comprises traces, wherein an orthographic projection of the traces on the flexible substrate is overlapped with the first region and the second region, and the orthographic projection of the traces on the flexible substrate is not overlapped with the third region,
wherein the first region comprises a plurality of first hole structures, and the third region comprises a plurality of second hole structures, the functional film layer further comprises a barrier, wherein an orthographic projection of the barrier on the flexible substrate is not overlapped with the first hole structure and the second hole structure.

2. The display substrate according to claim 1, wherein each of the first hole structures and each of the second hole structures are in a strip shape.

3. The display substrate according to claim 2, wherein the plurality of first hole structures comprise: at least one first hole structure extending in a first direction and at least one first hole structure extending in a second direction;
wherein the first direction is intersected with the second direction.

4. The display substrate according to claim 3, wherein the plurality of second hole structures comprise: at least one second hole structure extending in a third direction and at least one second hole structure extending in a fourth direction;
wherein the third direction is intersected with the fourth direction.

5. The display substrate according to claim 2, wherein the plurality of second hole structures comprise: at least one second hole structure extending in a third direction and at least one second hole structure extending in a fourth direction;
wherein the third direction is intersected with the fourth direction.

6. The display substrate according to claim 2, wherein the extending directions of the plurality of first hole structures are parallel.

7. The display substrate according to claim 6, wherein a boundary line between the second region and the third region is an arc; and
the extending directions are parallel to a tangent to the arc, or the extending directions are perpendicular to a tangent to the arc.

8. The display substrate according to claim 2, wherein the extending directions of the plurality of second hole structures are parallel.

9. The display substrate according to claim 1, wherein one of the plurality of first hole structures is a through hole or a blind hole, and one of the plurality of second hole structures is a through hole or a blind hole.

10. The display substrate according to claim 1, wherein the functional film layer further comprises: a first pixel in the non-stretch region, and a second pixel in the first region; wherein an orthographic projection of the second pixel on the flexible substrate is not overlapped with one of the plurality of first hole structures.

11. The display substrate according to claim 1, wherein the display substrate further comprises: a packaging film layer; wherein the packaging film layer is disposed on one side, distal from the flexible substrate, of the functional film layer.

12. The display substrate according to claim 11, wherein the packaging film layer comprises: an inorganic layer and an organic layer that are sequentially laminated in a direction going away from the flexible substrate; wherein an orthographic projection of the inorganic layer on the flexible substrate is overlapped with the first region, the second region, and the third region, an orthographic projection of the organic layer on the flexible substrate is overlapped with the first region, and an orthographic projection of the organic layer on the flexible substrate is not overlapped with the second region or the third region.

13. The display substrate according to claim 1, wherein the flexible substrate is rectangular; and the flexible substrate comprises four said stretch regions, each of the stretch regions being disposed at a corner of the flexible substrate.

14. A display device, comprising: a curved cover glass, and a display substrate; wherein, the curved cover glass has a boundary bent to one side, proximal to the display substrate, of the curved cover glass, and the display substrate is attached to the curved cover glass; the display substrate comprises: a flexible substrate, comprising a non-stretch region and at least one stretch region, wherein each of the at least one stretch region is proximate a boundary of the flexible substrate relative to the non-stretch region, and each of the at least one stretch region comprises a first region, a second region, and a third region that are sequentially arranged in a direction going away from the non-stretch region, and at least part of the first region and at least part of the third region have a thickness smaller than that of the second region, the second region has a thickness equal to that of the non-stretch region; and a functional film layer on one side of the flexible substrate, wherein both the non-stretch region and the first region constitute a display region of the flexible substrate, wherein the functional film layer comprises traces, wherein an orthographic projection of the traces on the flexible substrate is overlapped with the first region and the second region, and the orthographic projection of the traces on the flexible substrate is not overlapped with the third region, wherein the first region comprises a plurality of first hole structures, and the third region comprises a plurality of second hole structures, the functional film layer further comprises a barrier, wherein an orthographic projection of the barrier on the flexible substrate is not overlapped with the first hole structure and the second hole structure.

15. A display substrate, comprising:

a flexible substrate, comprising a non-stretch region and at least one stretch region, wherein each of the at least one stretch region is proximate a boundary of the flexible substrate relative to the non-stretch region, and each of the at least one stretch region comprises a first region, a second region, and a third region that are sequentially arranged in a direction going away from the non-stretch region, and at least part of the first region and at least part of the third region have a thickness smaller than that of the second region, the second region has a thickness equal to that of the non-stretch region; and a functional film layer on one side of the flexible substrate, wherein both the non-stretch region and the first region constitute a display region of the flexible substrate, wherein the functional film layer comprises traces, wherein an orthographic projection of the traces on the flexible substrate is overlapped with the first region and the second region, and the orthographic projection of the traces on the flexible substrate is not overlapped with the third region, wherein the first region comprises a plurality of first hole structures, and the third region comprises a plurality of second hole structures, wherein the functional film layer further comprises: a first pixel in the non-stretch region, and a second pixel in the first region;

wherein an orthographic projection of the second pixel on the flexible substrate is not overlapped with one of the plurality of first hole structures.

* * * * *